(12) United States Patent
Kern et al.

(10) Patent No.: US 10,599,350 B2
(45) Date of Patent: Mar. 24, 2020

(54) USING A DIFFERENTIAL MEMORY STORAGE ARCHITECTURE FOR UPDATING A MEMORY AREA

(71) Applicant: Infineon Technologies AG, Neubiberg (DE)

(72) Inventors: Thomas Kern, Ascheim (DE); Ulrich Backhausen, Taufkirchen (DE)

(73) Assignee: Infineon Technologies AG, Neubiberg (DE)

(*) Notice: Subject to any disclaimer, the term of this patent is extended or adjusted under 35 U.S.C. 154(b) by 0 days.

(21) Appl. No.: 15/955,327

(22) Filed: Apr. 17, 2018

(65) Prior Publication Data

US 2018/0307424 A1 Oct. 25, 2018

(30) Foreign Application Priority Data

Apr. 19, 2017 (DE) .................. 10 2017 108 288

(51) Int. Cl.
| | |
|---|---|
| *G06F 3/06* | (2006.01) |
| *G06F 8/654* | (2018.01) |
| *G11C 16/04* | (2006.01) |
| *G11C 16/10* | (2006.01) |
| *G11C 13/00* | (2006.01) |
| *G11C 16/28* | (2006.01) |
| *G11C 11/16* | (2006.01) |

(52) U.S. Cl.
CPC .......... *G06F 3/0629* (2013.01); *G06F 3/0604* (2013.01); *G06F 3/0679* (2013.01); *G06F 8/654* (2018.02); *G11C 11/1673* (2013.01); *G11C 11/1675* (2013.01); *G11C 13/004* (2013.01); *G11C 13/0069* (2013.01); *G11C 16/0408* (2013.01); *G11C 16/10* (2013.01); *G11C 16/28* (2013.01); *G11C 13/0004* (2013.01); *G11C 13/0007* (2013.01); *G11C 13/0011* (2013.01); *G11C 2013/0042* (2013.01)

(58) Field of Classification Search
CPC .... G06F 3/0604; G06F 3/0629; G06F 3/0679; G06F 8/654; G11C 16/0408
See application file for complete search history.

(56) References Cited

U.S. PATENT DOCUMENTS

| | | | |
|---|---|---|---|
| 2003/0037282 A1* | 2/2003 | Berg | ........................ G06F 8/65 714/11 |
| 2008/0195887 A1* | 8/2008 | Luk | ..................... G06F 11/1064 714/5.11 |

(Continued)

OTHER PUBLICATIONS

Office Action dated Aug. 28, 2019 for German Patent Application No. 102017108288.3.

*Primary Examiner* — Larry T Mackall
(74) *Attorney, Agent, or Firm* — Schiff Hardin LLP

(57) ABSTRACT

A method is suggested for updating a memory comprising a first memory area and a second memory area, the method comprising the steps: (a) using a first image of data that is stored in the first memory area while writing a second image of data to the second memory area; (b) switching to using the second image of data that is stored in the second memory area; (c) writing an inverse image of the second image to the first memory area; and (d) using the first memory area and the second memory area as a differential memory. Also, a corresponding device is provided.

17 Claims, 7 Drawing Sheets

(56) References Cited

U.S. PATENT DOCUMENTS

| | | | | |
|---|---|---|---|---|
| 2011/0320089 A1* | 12/2011 | Lewis | .................... | G01C 21/32 |
| | | | | 701/29.6 |
| 2014/0136826 A1* | 5/2014 | Paek | ..................... | G06F 9/4401 |
| | | | | 713/1 |
| 2014/0143768 A1* | 5/2014 | Kazalski | .................... | G06F 8/60 |
| | | | | 717/171 |
| 2014/0282470 A1 | 9/2014 | Buga et al. | | |
| 2015/0347227 A1* | 12/2015 | Rabenalt | ............... | G06F 3/0679 |
| | | | | 714/764 |

* cited by examiner

| READ | Cell of 102 | Cell of 103 | Write |
|---|---|---|---|
| 0 | 0 | 0 | 1 |
| 1 | 1 | 1 | 0 | sense amplifier 105 in single-ended read mode complementary data $B_C$ written to memory area 103

| READ | Cell of 102 | Cell of 103 | Write |
|---|---|---|---|
| 1 | 0 | 0 | - |
| 0 | 1 | 1 | - | sense amplifier 105 in single-ended read mode

USING A DIFFERENTIAL MEMORY STORAGE ARCHITECTURE FOR UPDATING A MEMORY AREA

BACKGROUND

Embodiments of the present disclosure relate to an efficient approach for updating data of a memory.

SUMMARY

A first embodiment relates to a method for updating a memory comprising a first memory area and a second memory area:
  (a) using a first image of data that is stored in the first memory area while writing a second image of data to the second memory area;
  (b) switching to using the second image of data that is stored in the second memory area;
  (c) writing an inverse image of the second image to the first memory area;
  (d) using the first memory area and the second memory area as a differential memory.

A second embodiment relates to a device for updating a memory,
  wherein the memory comprises a first memory area and a second memory area,
  wherein the device comprises a processing unit that is arranged for:
    (a) using a first image of data that is stored in the first memory area while writing a second image of data to the second memory area;
    (b) switching to using the second image of data that is stored in the second memory area;
    (c) writing an inverse image of the second image to the first memory area;
    (d) using the first memory area and the second memory area as a differential memory.

A third embodiment relates to a computer program product directly loadable into a memory of a digital processing device, comprising software code portions for performing the steps of the method as described herein.

A fourth embodiment relates to a computer-readable medium having computer-executable instructions adapted to cause a computer system to perform the steps of the method as described herein.

BRIEF DESCRIPTION OF THE DRAWINGS

Embodiments are shown and illustrated with reference to the drawings. The drawings serve to illustrate the basic principle, so that only aspects necessary for understanding the basic principle are illustrated. The drawings are not to scale. In the drawings the same reference characters denote like features.

DETAILED DESCRIPTION OF THE PREFERRED EMBODIMENTS

Figure 1:
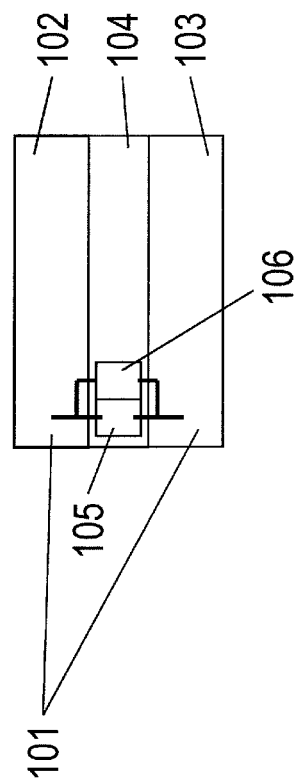
FIG. 1 shows a symbolic diagram of a memory array comprising two separate memory areas, which are combined via a symbolic layer for read/write purposes.

In the automotive field, product recalls and other updates that involve software in the vehicle have an increasing demand to be conducted online, e.g., via an Internet connection. Any download, update or revision of data that is conducted online over an air interface, e.g., a mobile communication interface, is also referred to as SOTA (Software Over the Air). The advantages of SOTA extend from a mere correction of errors towards adding new software that can be conveniently installed in the vehicle without any significant downtime. Hence, the user does no longer have to drive the vehicle to the garage and wait for the update to be conducted.

SOTA may increasingly be used by Original Equipment Manufacturers (OEMs), which significantly benefit from updating the functionality and the features of the vehicle "over the air" (online).

In particular one of the following scenarios (1) to (3) may be used to enable SOTA:

(1) The vehicle may comprise a microcontroller, a PFlash memory and a communication interface. The microcontroller may be coupled to the PFlash memory and the communication interface via a bus. The communication interface is connectable (via an Internet-over-the-air connection) with a central storage unit in the vehicle, in particular an external (remote) entity comprising such central storage. The microcontroller, PFlash memory and communication interface may be part of an Electronic Control Unit (ECU) of the vehicle.

In this scenario (1), the software update is conducted from the central storage via the communication interface to the PFlash memory.

It is noted that instead of the microcontroller may comprise at least one core and/or at least one CPU (Central Processing Unit). It is also an option that the microcontroller comprises the PFlash memory and/or the communication interface.

(2) In contrast to scenario (1), the ECU comprises an additional serial peripheral interface (SPI) that is connected to the bus. A local storage that may be part of the ECU is connected to the SPI.

In this scenario (2), the software update is conducted from the central storage via the communication interface to the local storage. This scenario (2) decreases the downtime compared to scenario (1), but it increases the cost due to the additional components required.

(3) In contrast to scenario (1), the ECU comprises an additional PFlash memory that is connected to the bus.

In this scenario (3), the software update can be conducted into the doubled (second) PFlash memory and the memories may be swapped after a successful download. Compared to the scenarios (1) and (2), this scenario further decreases the downtime, but it also further increases the cost due to the costly second PFlash memory.

It is noted that the PFlash memory may be any Code-Flash memory or Instruction-Flash memory, which may comprise code and/or static or low frequent data portions.

Conventional embedded flash technologies (in contrast to stand-alone memories) may be in particular based on a 1 bit per cell solution, i.e. one bit of information is stored in a single memory cell. This especially applies for PFlash solutions due to the fact that they do not reveal high update rates and thus do not sustain significant stress and/or degradation by high write/erase cycles. Classical and mature embedded non-volatile-memory concepts like Floating Gate Flash generate significantly more integrations problems reaching advanced technology nodes (e.g., deploying High k metal gate processes). This easier integration in a CMOS ase (advanced silicon etching) process and eventually lower cost make emerging memory solutions like PCRAM, ReRAM, MRAM and others attractive. However, emerging memory concepts sometimes lack maturity and reliability. One solution to overcome the reduced reliability and to be accepted, e.g., in the automotive market, is to gain reliability by using a differential or complementary approach, which may store, e.g., 0.5 bit/cell.

For example, complementary cells may be used to increase the reliability for accessing a valid bit based on (at least) two memory cells due to larger read window common mode suppression and significantly lower bit failure rates.

This may be achieved via a differential read memory. Such memory may improve reliability, e.g., even after a high number of write/erase cycles, but requires (at least) two memory cells per data bit. Each data bit may thus be represented by at least one true cell and at least one complementary cell. In particular, an equal number of true and complementary cells may be used to represent a data bit.

For example, a logical "0" of the data bit can be associated with a physical "0" of the true cell and a physical "1" of the complementary cell. A logical "1" of the data bit can be associated with a physical "1" of the true cell and a physical "0" of the complementary cell.

It is noted that a physical "0" can be regarded as a physical property assigned to a state "0". Accordingly, a physical "1" can be regarded as a physical property assigned to a state "1".

Hence, two memory cells of a memory may store complementary information, i.e. they have opposite states.

The physical differences between the cells of the true cell and the complementary cell may be based on a variation of a voltage, a resistance, a current and/or a variation of a signal over time.

Complementary cells may be used in combination with a SOTA approach to efficiently allow for a safe and reliable update of the software and at the same time utilize an optimized (reduced) area of memory.

FIG. 1 shows a symbolic diagram of a memory array 101 comprising a memory area 102 and a memory area 103.

Memory cells of the memory area 102 may be used as true memory cells and memory cells of the memory area 103 may be used as complementary memory cells. In this scenario, the memory areas 102, 103 store the same content, except that one of the memory areas is the inverse of the other memory area, i.e. each bit of information is represented by a true memory cell carrying the true value and a complementary memory cell carrying the opposite (inverse) value. This has a significant advantage, because cell errors can be detected if the true and the complementary memory cell that are associated with the same bit of information show the same value, i.e. either both memory cells show the value "0" or the value "1", which—by definition of the differential read memory—is not a valid state.

A symbolic layer 104 comprises a sense amplifier 105 that is connected to both memory areas 102, 103. The sense amplifier 105 is arranged
- for differential reading complementary cells (i.e. a cell comprising the true value of a bit of information from the memory area 102 and a cell comprising the complementary value of this bit of information from the memory area 103) or
- for reading either cells of the memory area 102 or of the memory area 103 (in a single ended mode).

The sense amplifier 105 may in particular read both memory areas 102, 103 during a single ended operation at the same time or at substantially the same time. For example, the content read from the memory area 103 may be verified and the normal single ended read is conducted for this content on memory area 102 (i.e. a content read from memory area 102 is verified by also reading the memory area 103).

Also, an interface 106 is depicted that can be used for writing data into memory cells of either the memory area 102 or the memory area 103.

The memory cells of the memory area 102 can be read and/or written independently from a read operation of the memory cells of the memory area 103 and vice versa.

Figure 2:
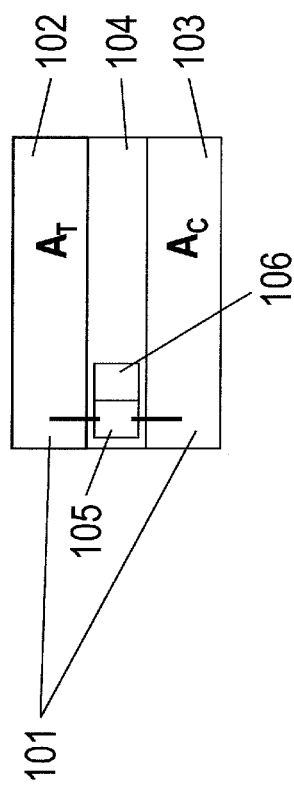
FIG. 2 shows the memory array in a normal mode, wherein the memory array is operated as a differential read memory.

FIG. 2 shows the memory array 101 with the memory area 102 comprising an image $A_T$ (which equals an image A) and the memory area 103 comprises a complementary image $A_C$. Hence, a bit of information that is stored in the memory array 101 is mapped to two (complementary) memory cells, i.e. a true memory cell of the memory area 102 (also referred to as true cell), which shows the true value, and a complementary memory cell of the memory area 103 (also referred to as complementary cell), which shows the complementary value (i.e. the opposite or inverse value of the associated true cell).

The sense amplifier 105 operates as a differential amplifier. The content obtained from the memory array 101 corresponds to the image A, wherein the true cells comprise the true image $A_T$ (which equals the image A) and the complementary cells comprise the complementary image $A_C$ (which equals the inverse image A).

In this mode, only read access is conducted towards the memory array 101. A value "0" is read in case the true cell has the value "0" and the associated complementary cell has the value "1". A value "1" is read in case the true cell has the value "1" and the associated complementary cell has the value "0".

Figure 3:
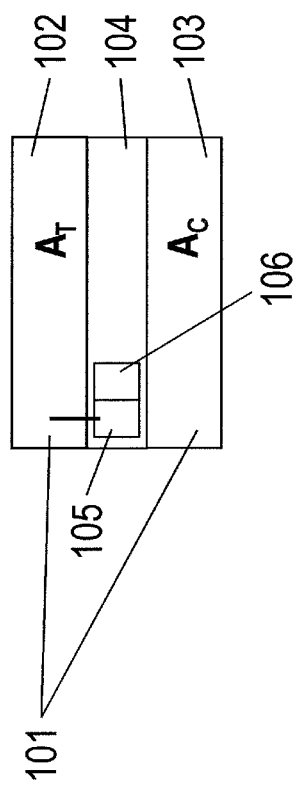
FIG. 3 shows the memory array operated in a first SOTA mode.

FIG. 3 shows the memory array 101 in a first SOTA mode, wherein only the memory area 102 is read.

In the first SOTA mode, the sense amplifier 105 operates as a single-ended amplifier, only providing the image "A" from the true image $A_T$ of the memory area 102 (the true cells) without considering the content of the memory area 103.

Figure 4:
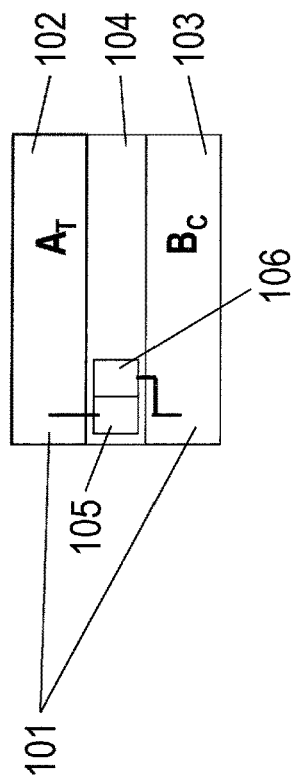
FIG. 4 shows the memory array operated in a second SOTA mode.

FIG. 4 shows the memory array 101 in a second SOTA mode. The sense amplifier 105 still operates as a single-ended amplifier, only providing the image A from the true image $A_T$ of the memory area 102 (the true cells).

In addition, an image $B_C$ is written to the memory cells of the memory area 103. The image $B_C$ may be a complementary image of an image B. It is noted that the image B may be different from the image A.

Advantageously, the memory area 102 and the memory area 103 are accessible independently from each other, which efficiently allows reading the image A from the memory area 102 and writing or verifying of the image $B_C$ to the memory area 103.

Figure 5:
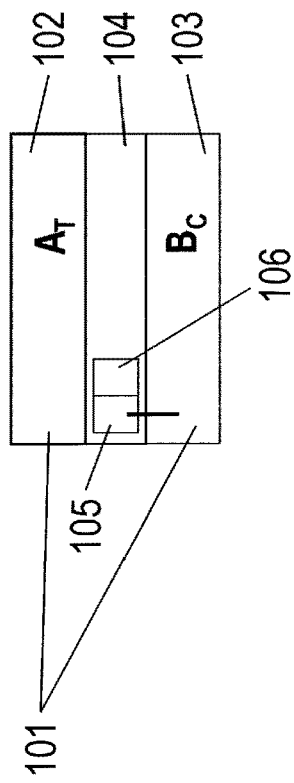
FIG. 5 shows the memory array operated in a third SOTA mode.

FIG. 5 shows the memory array 101 in a third SOTA mode. The sense amplifier 105 operates as a single-ended amplifier, now providing the image B from the complementary image $B_C$ of the memory area 103.

In other words, after the updated data has been entered to the memory area 103, this data is now used via the sense amplifier 105. At this stage, the memory area 103 carries the user data in a complementary form (i.e. $B_C$), which may require to invert this data (e.g., at the sense amplifier 105 or at any other component) to arrive at the image B. Also, the memory area 102 at this stage still carries the image $A_T$ (i.e. A), which—after the successful update of the memory area 103—is no longer used.

Figure 6:
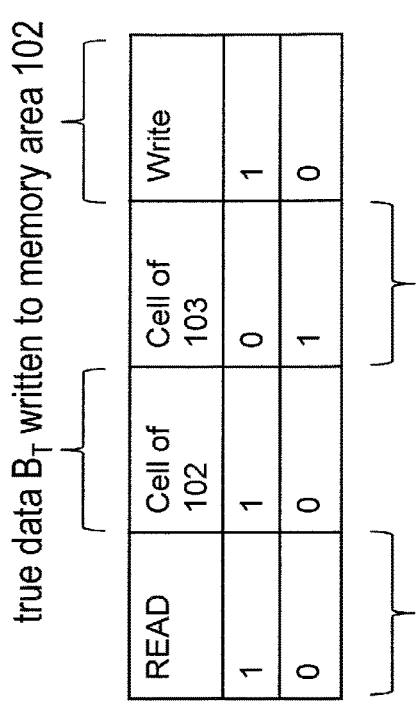
FIG. 6 shows the memory array operated in a fourth SOTA mode.
Figure 6:
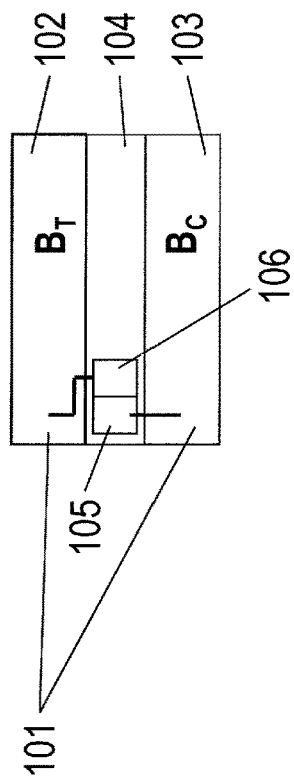

FIG. 6 shows the memory array 101 in a fourth SOTA mode. The sense amplifier 105 still operates as a single-ended amplifier providing the image B from the complementary image $B_C$ of the memory area 103.

The image $B_T$ (=B) is written to the memory area 102. This can be achieved by copying the inverted image $B_C$ from the memory area 103 to the memory area 102 or by obtaining the image $B_T$ from, e.g., a central data storage.

Figure 7:
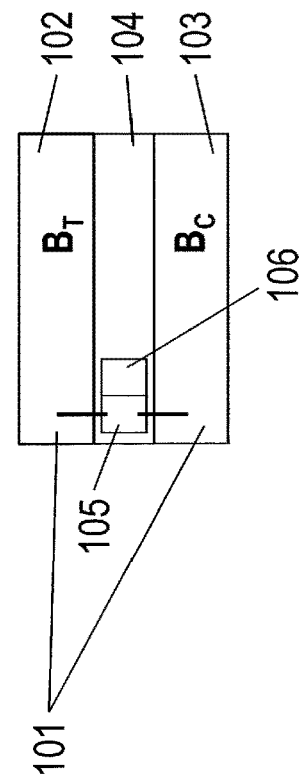
FIG. 7 shows the memory array operated again as a differential read memory after completion of SOTA.

FIG. 7 shows the memory array 101 after the SOTA is completed. The sense amplifier 105 (again) operates as a differential amplifier. The content obtained from the memory array 101 corresponds to an image B, wherein the true cells (i.e. of the memory area 102) comprise the true image $B_T$ (which equals the image B) and the complementary cells (i.e. of the memory area 103) comprise the complementary image $B_C$.

In this mode, only read access is conducted towards the memory array 101. A value "0" is read in case the true cell has the value "0" and the associated complementary cell has the value "1". A value "1" is read in case the true cell has the value "1" and the associated complementary cell has the value "0".

Figure 8:
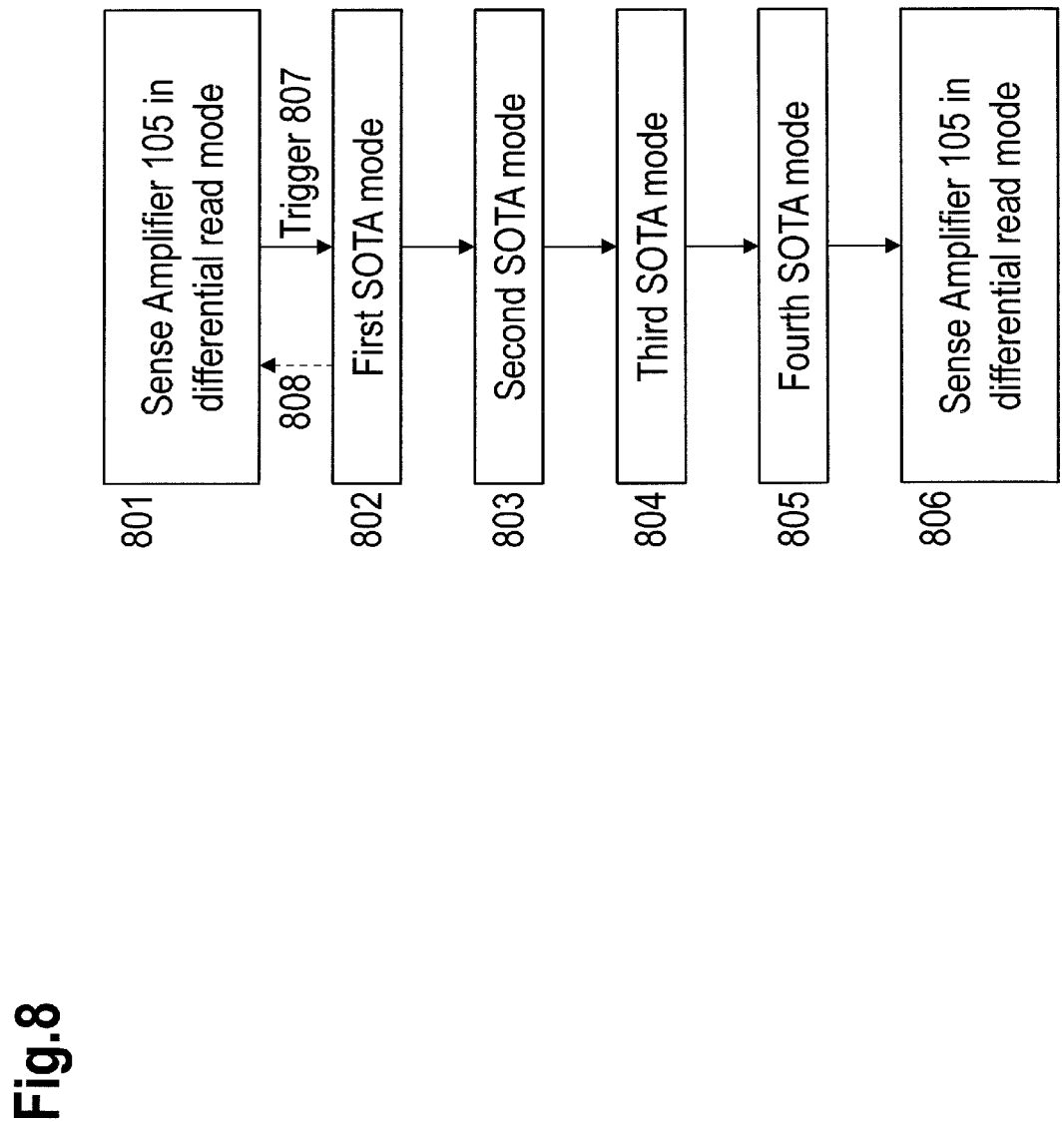
FIG. 8 shows a schematic flow chart comprising steps to illustrate an update of the differential read memory.

FIGS. 2 to 7 hence correspond to a transition of modes, which are summarized in FIG. 8:

Step 801: The SOTA approach described starts with two memory areas 102, 103 of the memory array 101, which carry complementary data of an image A.

Step 802: In the first SOTA mode, the read access to the data (of the image A) is restricted to the memory area 102.

Step 803: In the second SOTA mode an updated image B (in its true form $B_T$ or in its complementary form $B_C$) is written to the memory area 103.

Step 804: In the third SOTA mode, the updated image B is used instead of the image A by restricting the read access to the memory area 103 (instead of the memory area 102).

Step 805: In the fourth SOTA mode, the updated (or new) image B is written (e.g., copied) to the memory area 102: If the true form $B_T$ of the image B was written to the memory area 103, the complementary form $B_C$ of the image B will be written to the memory area 102; if the complementary form $B_C$ of the image B was written to the memory area 103, the true form $B_T$ of the image B will be written to the memory area 102.

Step 806: The memory array 101 is operated as a differential read memory, wherein the memory areas 102, 103 comprise complementary data of the image B.

A trigger 807 may be used to start a transition from the step 801 to the step 802. Such trigger may be a refresh request after a verify operation or it may be based on a refresh cycle that is triggered according to a predetermined regular or non-regular schedule. In step 802 it may be checked whether a SOTA is pending or could/should be conducted. In the affirmative, the SOTA can be initiated. If no SOTA is pending, it may be returned to step 801 (as indicated by a dashed line 808). The trigger 807 may, however, be based on a SOTA request and hence a step to initiate the update procedure.

Figure 9:
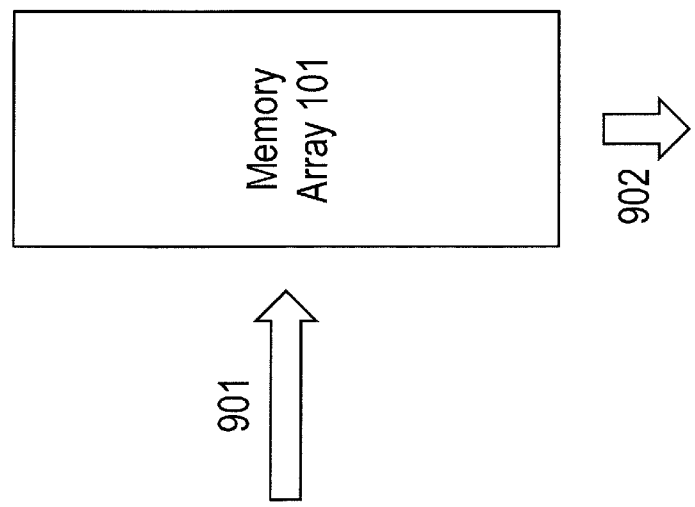
FIG. 9 shows the memory array operated as differential read memory supplying information based on an access to an address of the memory array.

FIG. 9 shows the memory array 101 active in normal mode (corresponding to FIG. 2 and FIG. 7 and to steps 801 and 806): The sense amplifier is in a differential read operation and the memory array 101 is used as a complementary memory providing an increased redundancy for error detection purposes as each bit of information is split to two complementary memory cells.

A read address 901 is used to access the memory array 101 and data 902 are delivered as a result of such read access.

Figure 10:
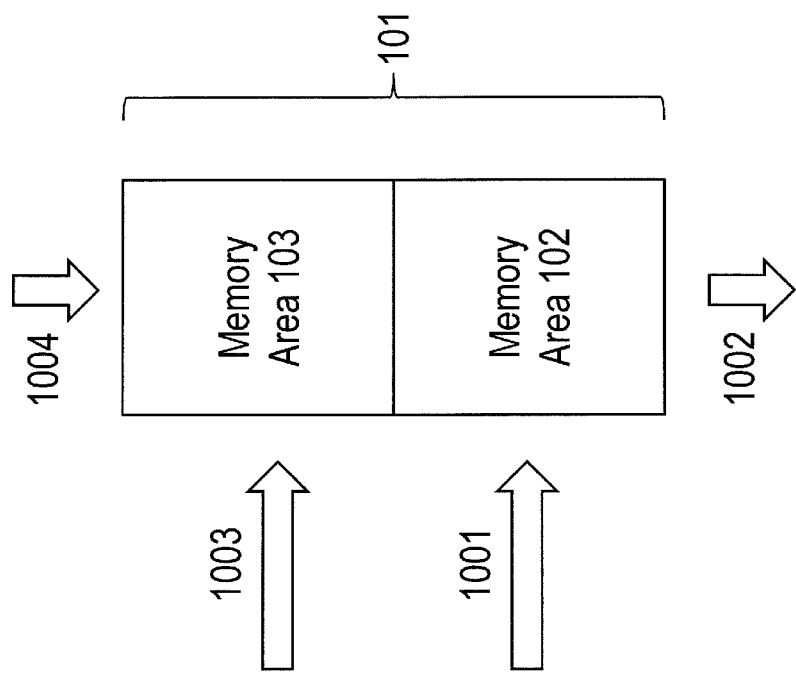
FIG. 10 shows the memory array subdivided into two memory areas, wherein one memory area is subject to a write operation and (at the same time or substantially at the same time) the other memory area is subject to a read operation.

FIG. 10 shows the memory array 101, which is divided into two memory areas 102 and 103. The memory areas 102 and 103 may be physically separated from each other. For each of the memory areas, separate read and write/verify addresses can be used to access/write data. Also, a separate write/verify bus and a separate read bus can be provided for the memory areas 102, 103.

FIG. 10 shows the example during the second SOTA mode where the image A is read from the memory area 102 by supplying a read address 1001 and obtaining data 1002. Also, the image B (in true or complementary form) 1004 is written to the memory area 103 via a separate write address 1003.

During this second SOTA mode, the sense amplifier only reads the data from the memory area 102.

Figure 11:
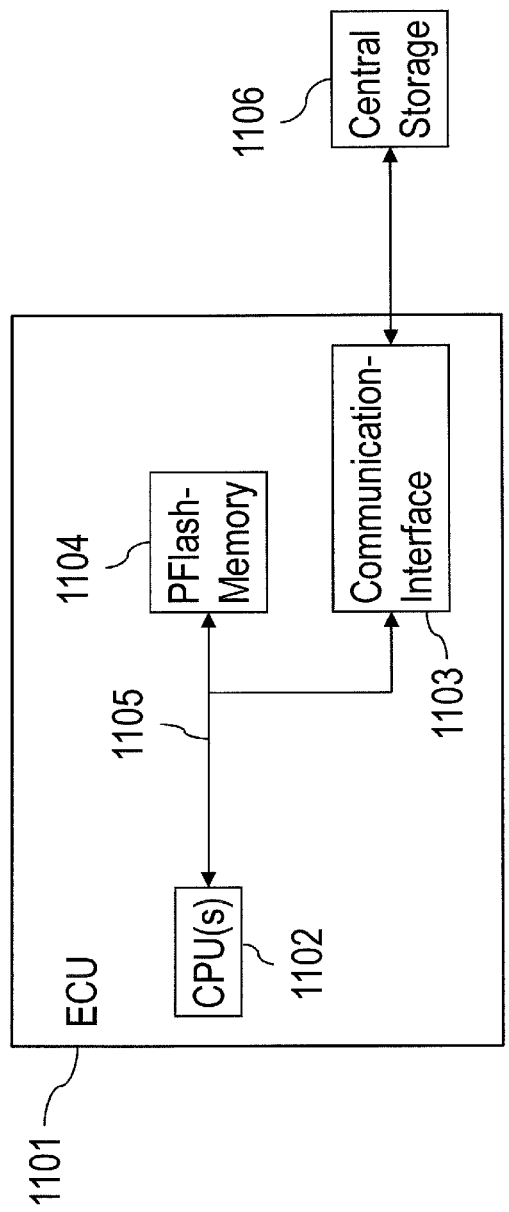
FIG. 11 shows a system comprising an Electronic Control Unit (ECU) that can be updated via a central storage.

FIG. 11 shows an exemplary ECU 1101 (ECU: Electronic Control Unit), which may be part of a vehicle, in particular a vehicle. The ECU comprises a CPU 1102, a PFlash memory 1104 and a communication interface 1103. The CPU 1102 may be coupled to the PFlash memory 1104 and the communication interface 1103 via a bus 1105. The communication interface 1103 is connectable (via an Internet-over-the-air connection) with a central storage 1106, in particular an external (remote) entity comprising such central storage 1106. The PFlash memory 1104 may correspond to the memory array 101 as shown in, e.g., FIG. 10.

The CPU 1102, PFlash memory 1104, communication interface 1103 and bus 1105 may be integrated in an enhanced microcontroller system like Infineon's Aurix™ device.

The software update is conducted by transferring data from the central storage 1106 via the communication interface 1103 to the PFlash memory 1104.

Advantageously, the solution presented herein suggests a separation of the true data and the complementary data of a differential read memory. Due to such separation, a differential read mode may be separated from a single-ended mode, where only one of the memory areas temporarily supplies the first image of data.

During this time, the other memory area is updated with a revised second image of data, which is activated after the update was successful. Then, the outdated first image of data can be overwritten by the complementary second image.

It is however an option to initially write the second image in its true or complementary form to the memory area that is subject to the SOTA. After this update, the other memory area receives the respective other (complementary or true) image.

It is another advantage that SOTA can be achieved with a high degree of reliability and flexibility at a reduced cost, due to the limited additional Flash memory required.

The memory may advantageously be capable of allowing separate write (incl. verify) and read accesses (simultaneously or substantially simultaneously) to the different memory areas. The update of the software may hence be conducted during the runtime of a vehicle.

It is another option that several memory areas (more than two) may be used to further increase the flexibility and/or level of redundancy. For example, one bit of information may be spread (e.g., via a code) to more than one memory cell. If, e.g., a single bit of information is coded into three bits, each such bit may be implemented by a physically separate memory cell of a, e.g., physically separate memory area. Various codes may be used to spread a single bit to several bits. This facilitates and even improves error detection and/or error correction capabilities.

It is noted that SOTA is an example that may be used in combination with the solutions described herein. However, the subject matter of the disclosure is not restricted to the SOTA scenario. It may be applicable for any other approach that temporarily utilizes a portion of a memory for update, correction or revision purposes.

The examples suggested herein may in particular be based on at least one of the following solutions. In particular combinations of the following features could be utilized in order to reach a desired result. The features of the method could be combined with any feature(s) of the device, apparatus or system or vice versa.

A method is provided for updating a memory comprising a first memory area and a second memory area:
  (a) using a first image of data that is stored in the first memory area while writing a second image of data to the second memory area;
  (b) switching to using the second image of data that is stored in the second memory area;
  (c) writing an inverse image of the second image to the first memory area;
  (d) using the first memory area and the second memory area as a differential memory.

The first image of data and the second image of data are different images. These images refer to different content and they are not only complementary images. An inverse image is also referred to as a complementary image.

In a differential memory, each bit has at least two representations, i.e. at least one true cell and at least one complementary cell. The true cell is stored in the first memory area and the complementary cell is stored in the second memory area. The memory (also referred to as memory array) may be operated in a differential read mode thereby using the true memory cell and the complementary memory cell (which both represent a single bit of information) to determine the value of the bit (i.e. either "0" or "1"). Also, each memory area may be operated in a so-called single-ended mode, wherein the bit of information is obtained from either the first memory area or the second memory area without considering the respective other memory area. This is applicable in case "the first image of data is used" or "the second image of data is used". This applies in particular to a portion of the data. This also applies in case at least a portion of such data is enabled to be used. In this case, the respective other memory area can be reprogrammed (i.e. data can be written to this memory area).

It is noted that "using the first/second image of data" in particular refers to utilizing the respectively stored data during runtime of a machine, device or system, in particular a vehicle. Hence, this data stored can be used to operate the unit while the other memory area is updated. This allows for a high degree of flexibility, because for a limited period of time the differential mode of operation is suspended to update the image of data. After the (successful) update, the differential mode of operation can be re-entered.

Using the memory as a differential memory in particular refers to "using the memory as a differential read memory", i.e. a differential memory in read mode. A differential read amplifier compares values that are stored in two associated memory cells, wherein these cells may be spread across the first and second memory area and wherein one of the memory cell has the inverse value compared to the other memory cell.

It is noted that updating may refer to any change or revision of data. Hence, the data that is stored in the first memory area may be outdated or erroneous and it may need to be updated. This is achieved by updating the second memory area while still operating on the data stored in the first memory area. After the successful update, the operation switches to use the data (second image) stored in the second memory area. Then, the inverse (or complementary) image that is stored in the second memory area is written to the first memory area. After that, both images stored in the first and second memory area can be used as a differential (read) memory.

In an embodiment, the first memory area and the second memory area are located in different physical memories.

The memory areas may be located in different chips or in different devices.

In an embodiment, the memory is a Flash memory, in particular a PFlash memory.

The PFlash memory may be any Code-Flash memory, Program-Flash memory or Instruction-Flash memory, which may comprise code and/or data portions In an embodiment, the first memory area and the second memory area have separate read, write and/or verify accessibilities.

They may in particular have different read-, write- and/or verify-busses. It is in particular beneficial to allow for a separate (and at least temporarily simultaneous) read, write and/or verify operations being conducted on the memory areas.

In an embodiment, the method further comprises prior to step (a):
  using the first memory area and the second memory area as a differential memory.

Hence, a bit of information is distributed across at least one memory cell of the first memory area and at least one memory cell of the second memory area. In the differential mode of operation (i.e. the memory being used as differential memory) bit of information is determined by combining the associated memory cells.

In an embodiment, the method further comprises prior to step (a) or prior to step (b):
  receiving an update request.

In an embodiment,
  the update request is an update-over-the-air request, in particular a SOTA request or message and
  the second image of data is supplied via an air interface, in particular a mobile communication interface.

In an embodiment, the memory is part of an electronic control unit of a vehicle, in particular car.

In an embodiment, conducting the steps (a) to (c) are limited to a predetermined amount of time.

Hence, a limited time may be provided for conducting the actual update. If a time-out is reached before the update is completed, it may be regarded as invalid. In particular, a roll-back to the state prior to commencing the update can be conducted.

Also, a device for updating a memory is suggested,
  wherein the memory comprises a first memory area and a second memory area,
  wherein the device comprises a processing unit that is arranged for:
    (a) using a first image of data that is stored in the first memory area while writing a second image of data to the second memory area;
    (b) switching to using the second image of data that is stored in the second memory area;
    (c) writing an inverse image of the second image to the first memory area;
    (d) using the first memory area and the second memory area as a differential memory.

It is noted that the steps of the method stated herein may be executable on this processing unit as well.

It is further noted that said processing unit can comprise at least one, in particular several means that are arranged to execute the steps of the method described herein. The means may be logically or physically separated; in particular several logically separate means could be combined in at least one physical unit.

Said processing unit may comprise at least one of the following: a processor, a microcontroller, a hard-wired circuit, an ASIC, an FPGA, a logic device.

In an embodiment, the device is part of an Electronic Control Unit of a vehicle.

In an embodiment, the second image of data is supplied via an air interface, in particular a mobile communication interface.

In an embodiment, the memory array comprises at least one of the following:
  floating gate cells,
  PCRAM,
  RRAM,
  MRAM,
  CBRAM
  FERAM
  MONOS devices,
  nanocrystal cells,
  ROM.

Further, a computer program product is suggested that is directly loadable into a memory of a digital processing device, comprising software code portions for performing the steps of the method as described herein.

Also, a computer-readable medium is provided, which has computer-executable instructions adapted to cause a computer system to perform the steps of the method as described herein.

In one or more examples, the functions described herein may be implemented at least partially in hardware, such as specific hardware components or a processor. More generally, the techniques may be implemented in hardware, processors, software, firmware, or any combination thereof. If implemented in software, the functions may be stored on or transmitted over as one or more instructions or code on a computer-readable medium and executed by a hardware-based processing unit. Computer-readable media may include computer-readable storage media, which corresponds to a tangible medium such as data storage media, or communication media including any medium that facilitates transfer of a computer program from one place to another, e.g., according to a communication protocol. In this manner, computer-readable media generally may correspond to (1) tangible computer-readable storage media which is non-transitory or (2) a communication medium such as a signal or carrier wave. Data storage media may be any available media that can be accessed by one or more computers or one or more processors to retrieve instructions, code and/or data structures for implementation of the techniques described in this disclosure. A computer program product may include a computer-readable medium.

By way of example, and not limitation, such computer-readable storage media can comprise RAM, ROM, EEPROM, CD-ROM or other optical disk storage, magnetic disk storage, or other magnetic storage devices, flash memory, or any other medium that can be used to store desired program code in the form of instructions or data structures and that can be accessed by a computer. Also, any connection is properly termed a computer-readable medium, i.e., a computer-readable transmission medium. For example, if instructions are transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. It should be understood, however, that computer-readable storage media and data storage media do not include connections, carrier waves, signals, or other transient media, but are instead directed to non-transient, tangible storage media. Disk and disc, as used herein, includes compact disc (CD), laser disc, optical disc, digital versatile disc (DVD), floppy disk and Blu-ray disc where disks usually reproduce data magnetically, while discs reproduce data optically with lasers. Combinations of the above should also be included within the scope of computer-readable media.

Instructions may be executed by one or more processors, such as one or more central processing units (CPU), digital signal processors (DSPs), general purpose microprocessors, application specific integrated circuits (ASICs), field programmable logic arrays (FPGAs), or other equivalent integrated or discrete logic circuitry. Accordingly, the term "processor," as used herein may refer to any of the foregoing structure or any other structure suitable for implementation of the techniques described herein. In addition, in some aspects, the functionality described herein may be provided within dedicated hardware and/or software modules configured for encoding and decoding, or incorporated in a combined codec. Also, the techniques could be fully implemented in one or more circuits or logic elements.

The techniques of this disclosure may be implemented in a wide variety of devices or apparatuses, including a wireless handset, an integrated circuit (IC) or a set of ICs (e.g., a chip set). Various components, modules, or units are described in this disclosure to emphasize functional aspects of devices configured to perform the disclosed techniques, but do not necessarily require realization by different hardware units. Rather, as described above, various units may be combined in a single hardware unit or provided by a collection of interoperative hardware units, including one or more processors as described above, in conjunction with suitable software and/or firmware.

Although various exemplary embodiments of the subject matter of the disclosure have been disclosed, it will be apparent to those skilled in the art that various changes and modifications can be made which will achieve some of the advantages of the subject matter of the disclosure without departing from the spirit and scope of the subject matter of the disclosure. It will be obvious to those reasonably skilled in the art that other components performing the same functions may be suitably substituted. It should be mentioned that features explained with reference to a specific figure may be combined with features of other figures, even in those cases in which this has not explicitly been mentioned. Further, the methods of the subject matter of the disclosure may be achieved in either all software implementations, using the appropriate processor instructions, or in hybrid implementations that utilize a combination of hardware logic and software logic to achieve the same results. Such modifications to the inventive concept are intended to be covered by the appended claims.

The invention claimed is:

1. A method for updating a memory having a first memory area and a second memory area, the method comprising:
    (a) reading a first image of data that is stored in the first memory area in a single-ended mode while writing a second image of data to the second memory area in a single-ended mode;
    (b) switching to reading the second image of data that is stored in the second memory area in a single-ended mode;
    (c) writing an inverse image of the second image to the first memory area in a single-ended mode; and
    (d) reading, in a differential mode, the first memory area and the second memory area as a differential memory,
    wherein prior to step (a), the first memory area and the second memory area are read, in a differential mode, as a differential memory.

2. The method according to claim 1, wherein the first memory area and the second memory area are located in different physical memories.

3. The method according to claim 1, wherein the memory is a PFlash memory.

4. The method according to claim 1, wherein the first memory area and the second memory area have separate read, write, or verify accessibilities.

5. The method according to claim 1, further comprising prior to step (a) or prior to step (b):
    receiving an update request.

6. The method according to claim 5,
    wherein the update request is Software Over The Air (SOTA) request or message, and
    wherein the second image of data is supplied via a mobile communication interface.

7. The method according to claim 1, wherein the memory is part of an electronic controller of a vehicle.

8. The method according to claim 1, wherein conducting the steps (a) to (c) are performed within a predetermined amount of time.

9. The method according to claim 1, wherein in step (a) the first image of data that is stored in the first memory area and the second image of data that is written to the second memory area are different images.

10. The method according to claim 1, wherein in step (a) the first image of data that is stored in the first memory area and the second image of data that is written to the second memory area are not complementary of one another.

11. A device for updating a memory having a first memory area and a second memory area, the device comprising a processor configured to:
    (a) read a first image of data that is stored in the first memory area in a single-ended mode while writing a second image of data to the second memory area in a single-ended mode;
    (b) switch to reading the second image of data that is stored in the second memory area in a single-ended mode;
    (c) write an inverse image of the second image to the first memory area in a single-ended mode; and
    (d) read, in a differential mode, the first memory area and the second memory area as a differential memory,
    wherein prior to step (a), the first memory area and the second memory area are read, in a differential mode, as a differential memory.

12. The device according to claim 11, wherein the device is part of an Electronic Control Unit of a vehicle.

13. The device according to claim 11, wherein the second image of data is supplied via a mobile communication interface.

14. The device according to claim 11, wherein the memory array comprises at least one of floating gate cells, PCRAM, RRAM, MRAM, CBRAM, FERAM, MONOS devices, nanocrystal cells, or ROM.

15. A non-transitory computer-readable medium having computer-executable instructions stored thereon for updating a memory having a first memory area and a second memory area that, when executed by one or more processors, cause the one or more processors to:
    (a) read a first image of data that is stored in the first memory area in a single-ended mode while writing a second image of data to the second memory area in a single-ended mode;
    (b) switch to reading the second image of data that is stored in the second memory area in a single-ended mode;
    (c) write an inverse image of the second image to the first memory area in a single-ended mode; and
    (d) read, in a differential mode, the first memory area and the second memory area as a differential memory,
    wherein prior to step (a), the first memory area and the second memory area are read, in a differential mode, as a differential memory.

16. The non-transitory computer-readable media of claim 15, wherein the instructions for updating the memory further include instructions that, when executed by one or more processors, cause the one or more processors to:
    prior to step (a) or prior to step (b):
    receive an update request.

17. The non-transitory computer-readable media of claim 15, wherein the instructions for updating the memory further include instructions that, when executed by one or more processors, cause the one or more processors to:
    perform the steps (a) to (c) within a predetermined amount of time.

* * * * *